(12) United States Patent
Umemoto (10) Patent No.: US 7,646,079 B2
(45) Date of Patent: Jan. 12, 2010

(54) SEMICONDUCTOR DEVICE, METHOD OF MANUFACTURING THE SAME, CIRCUIT BOARD, AND METHOD OF MANUFACTURING THE SAME

(75) Inventor: Mitsuo Umemoto, Gyeonggi-Do (KR)

(73) Assignee: Sanyo Electric Co., Ltd., Osaka (JP)

( * ) Notice: Subject to any disclaimer, the term of this patent is extended or adjusted under 35 U.S.C. 154(b) by 73 days.

(21) Appl. No.: 11/511,503

(22) Filed: Aug. 29, 2006

(65) Prior Publication Data

US 2007/0052067 A1 Mar. 8, 2007

(30) Foreign Application Priority Data

Aug. 31, 2005 (JP) ............... 2005-252186

(51) Int. Cl.
*H01L 27/082* (2006.01)
*H01L 21/331* (2006.01)

(52) U.S. Cl. ............... 257/621; 257/774; 257/E21.578

(58) Field of Classification Search ............... 257/686, 257/700, 737, 584, 587; 174/255, 262, 263, 174/264, 265, 266; 29/831, 846, 847, 852; 361/792, 793, 794, 795; 216/17, 18, 19; 438/109, 265, 267, 366, 445, 595, 639
See application file for complete search history.

(56) References Cited

U.S. PATENT DOCUMENTS

| | | | |
|---|---|---|---|
| 6,591,495 B2 * | 7/2003 | Hirose et al. | ............... 29/846 |
| 7,045,896 B2 | 5/2006 | Ahn | |
| 7,397,128 B2 * | 7/2008 | Kubo et al. | ............... 257/774 |
| 2003/0160333 A1 * | 8/2003 | Kim et al. | ............... 257/774 |
| 2004/0061238 A1 | 4/2004 | Sekine | |
| 2004/0171268 A1 | 9/2004 | Yuasa | |
| 2004/0245623 A1 * | 12/2004 | Hara et al. | ............... 257/698 |
| 2005/0017338 A1 * | 1/2005 | Fukazawa | ............... 257/686 |
| 2005/0151228 A1 * | 7/2005 | Tanida et al. | ............... 257/620 |
| 2005/0189637 A1 * | 9/2005 | Okayama et al. | ............... 257/679 |
| 2006/0220178 A1 * | 10/2006 | Kubo et al. | ............... 257/532 |
| 2007/0249158 A1 * | 10/2007 | Okayama et al. | ............... 438/629 |

FOREIGN PATENT DOCUMENTS

CN          1534770          10/2004

(Continued)

OTHER PUBLICATIONS

Korean Office Action mailed Jun. 30, 2008 directed towards foreign application No. 10-2006-0080998; 3 pages.

*Primary Examiner*—Leonardo Andujar
*Assistant Examiner*—William Harriston
(74) *Attorney, Agent, or Firm*—Morrison & Foerster LLP (57) ABSTRACT

In the semiconductor device of the present invention, an active region is formed in an upper surface of a semiconductor substrate, and is surrounded by a trench filled with an oxide. A through-hole electrode electrically connected to the active region extends from the upper surface of the semiconductor substrate to a lower surface thereof. A bottom end of the through-hole electrode juts out of an insulating film covering the lower surface of the semiconductor substrate. Accordingly, a jutting portion of the through-hole electrode is embedded in the bonding material when the semiconductor device is mounted on a mounting board, and thus the connection reliability therebetween is improved.

6 Claims, 9 Drawing Sheets

FOREIGN PATENT DOCUMENTS

| | | |
|---|---|---|
| CN | 1574325 | 2/2005 |
| CN | 1658387 | 8/2005 |
| JP | 2001-326305 | 11/2001 |
| JP | 2005-183548 | 7/2005 |
| KR | 10-2004-0084830 | 10/2004 |
| KR | 10-2005-0054479 | 6/2005 |

\* cited by examiner

SEMICONDUCTOR DEVICE, METHOD OF MANUFACTURING THE SAME, CIRCUIT BOARD, AND METHOD OF MANUFACTURING THE SAME

Priority is claimed to Japanese Patent Application Number JP2005-252186 field on Aug. 31, 2005, the disclosure of which is incorporated herein by reference in its entirety.

BACKGROUND OF THE INVENTION

1. Field of the Invention

The present invention relates to a semiconductor device including a through-hole electrode passing through a semiconductor substrate, and a method of manufacturing the same. In addition, the present invention relates to a circuit board including a through-hole electrode passing through a semiconductor substrate and a method of manufacturing the same.

2. Description of the Related Art

A circuit device is conventionally formed, for instance, by mounting a semiconductor element, such as an IC chip, on a mounting board having a surface on which conductive paths are formed. There are two types of mounting configurations, which are face-up mounting and face-down mounting (flip chip technique), as methods for connecting the conducting paths on the mounting board to the semiconductor element.

In a case where the semiconductor device is mounted face up on the mounting board, the lower surface of the semiconductor element is fixed to the mounting board. Pad electrodes, which are formed on the upper surface of the semiconductor device, and the conducting paths on the mounting board are connected by wire bonding with thin metal wires. In the connecting method using wire bonding, however, it is necessary to secure regions in which form the thin metal wires around the semiconductor device. This causes a problem that an area necessary for mounting the semiconductor element is increased.

In a case where the semiconductor element is mounted face down on the mounting board, pad electrodes, which are arranged on the lower surface of the semiconductor element, and the conductive paths on the mounting board are connected with solder bumps or the like. By mounting the semiconductor device face down on the mounting board, an area necessary for mounting can be made equal to a size of the device. However, the mounting board has a thermal coefficient different from that of the semiconductor element. Hence, with a temperature change, thermal stress is applied to the solder bumps connecting the mounting board and the semiconductor element. The thermal stress results in a problem that a crack is generated in the solder bumps, thereby reducing connection reliability of the semiconductor element.

In order to solve this problem, a structure has been proposed in which the semiconductor element and the mounting board are connected with an interposer having a linear expansion coefficient equal to that of the chip.

Figure 9:
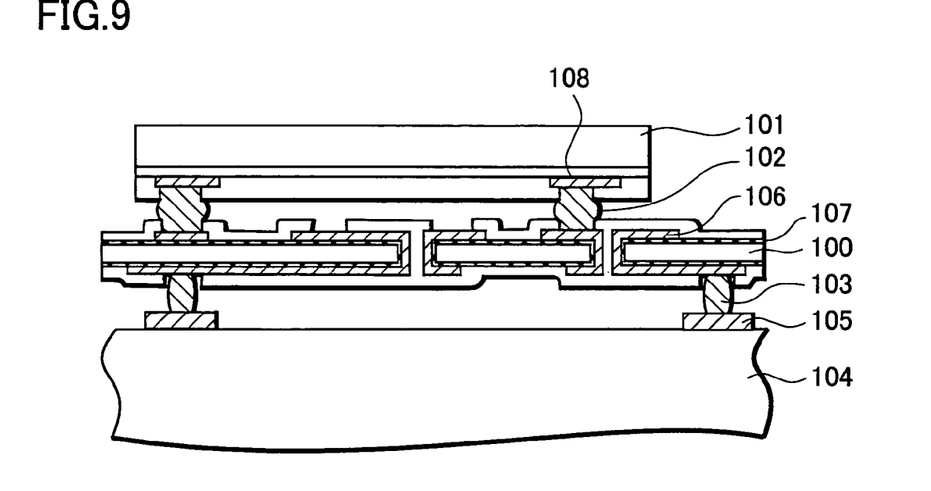
FIG. 9 is a cross-sectional view showing a conventional circuit board and a conventional semiconductor device.

By referring to a cross-sectional view of FIG. 9, descriptions will be provided for a configuration of connecting a semiconductor element by using a circuit board as an interposer. Here, a semiconductor element 101 which is an LSI chip including a large number of pads is mounted on a mounting board 104 with a circuit board 100 interposed in between. Connecting electrodes 102 connect the circuit board 100 and the pads on the lower surface of the semiconductor element 101. In addition, external electrodes 103 connect the circuit board 100 and conductive paths 105 formed on the upper surface of the mounting board 104. Furthermore, conductive patterns 106 insulated with insulating films 107 are formed respectively on the upper and lower surfaces of the circuit board 100.

Thermal stress applied to the connecting electrodes 102 is reduced by adopting, as a material of the circuit board 100, a material having a thermal coefficient closer to that of the semiconductor element 101 than that of the mounting board 104. Hence, it is possible to improve connection reliability of the connecting electrodes 102 against the thermal stress. The specific materials to be adopted for the circuit board 100 include resin, metal, ceramic or the like. Japanese Patent Application Publication No. 2001-326305 describes a technique in which a semiconductor made of silicon or the like is adopted as a material of the circuit board 100.

In the semiconductor element 101 shown in the description of the related art, however, the connecting electrodes 102 such as solder are attached respectively to electrodes 108 on the lower surface of the semiconductor device 101. Accordingly, bonding strength between the electrodes 108 and the connecting electrodes 102 is not sufficiently large, thereby causing a problem that the connecting electrodes 102 separate from the electrodes 108 due to thermal stress resulting from a temperature change and the like under the circumstances of using the semiconductor device 101.

Furthermore, the connecting electrodes 102 described above are also attached to the flat surfaces of the conductive patterns 106 which are provided on the surface of the circuit board 100. For this reason, a problem is caused that the connecting electrodes 102 and the conductive patterns 106 separate from the interface therebetween, when strong thermal stress is applied thereto.

SUMMARY OF THE INVENTION

The present invention has been made in view of the problems described above. A main object of the present invention is to provide a semiconductor device having improved connection reliability against external force such as thermal stress, and a method of manufacturing the same. Another main object is to provide a circuit board having improved connection reliability against external force such as thermal stress and a method of manufacturing the same.

A semiconductor device of the present invention includes an active region, a through hole and a through-hole electrode. The active region is formed in a first main surface of a semiconductor substrate. The through hole is provided to pass through the semiconductor substrate in a thickness direction. The through-hole electrode is formed inside the through hole, is electrically connected to the active region, and extends to a second main surface of the semiconductor substrate. In the semiconductor device, an end of the through-hole electrode juts out of the second main surface of the semiconductor substrate.

A method of manufacturing a semiconductor device of the present invention includes the: forming an active region in a first main surface of a semiconductor substrate; covering a second main surface of the semiconductor device with an insulating film; forming a through hole which passes through the semiconductor device to reach the insulating film; forming a through-hole electrode, which is electrically connected to the active region, inside the through hole; and removing the insulating film until an end of the through-hole electrode juts out of the insulating film.

A circuit board of the present invention includes a semiconductor substrate, a conductive pattern and a through-hole electrode. The conductive pattern is formed on a first surface of the semiconductor substrate. The through-hole electrode is electrically connected to the conductive pattern, passes through the semiconductor substrate, and extends to a second main surface of the semiconductor substrate. In the circuit board, an end of the through-hole electrode juts out of the second main surface of the semiconductor substrate.

A method of manufacturing a circuit board includes: preparing a semiconductor substrate whose first main surface is covered with an insulating film; forming a through hole which passes through the semiconductor substrate, and which reaches the insulating film; forming a conductive pattern on a second main surface of the semiconductor substrate, and then forming, inside the through hole, a through-hole electrode electrically connected to the conductive pattern; and removing the insulating film until an end of the through-hole electrode juts out of the insulating film.

DESCRIPTION OF THE EMBODIMENTS

First Embodiment

By referring to FIGS. 1A to 3, a configuration of a semiconductor device of a first embodiment will be described.

Figure 1A:
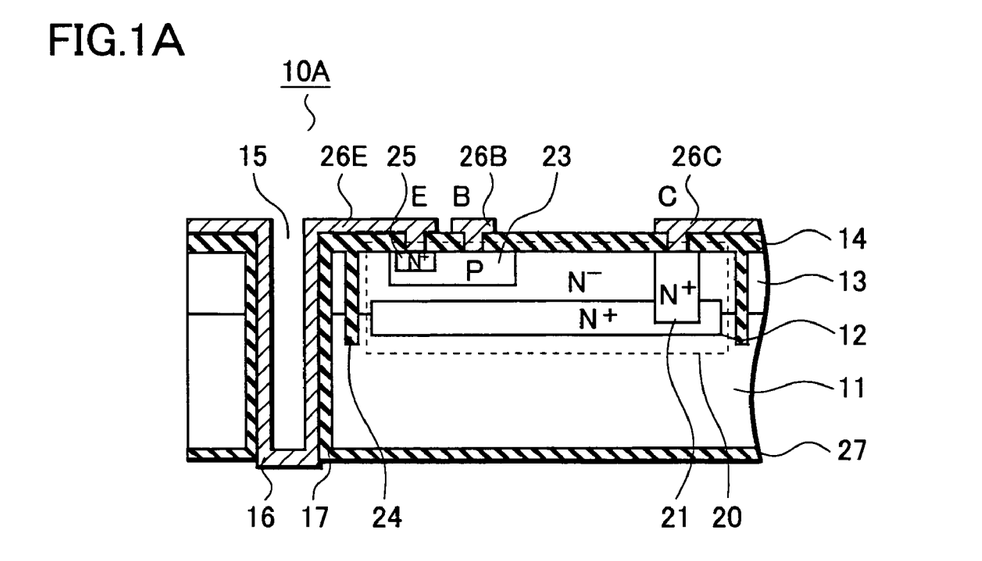
FIGS. 1A and 1B are cross-sectional views illustrating a semiconductor device of a first embodiment of the present invention.

As illustrated in a cross sectional view of FIG. 1A, in a semiconductor device 10A of this embodiment includes, an active region 20 is formed in an upper surface (first main surface) of a semiconductor substrate 11, and is surrounded by a trench 24 filled with an oxide. A through-hole electrode 16 electrically connected to the active region 20 extends from the upper surface of the semiconductor substrate 11 to a lower surface (second main surface) of the semiconductor substrate 11. A bottom end of the through-hole electrode 16 downwardly juts out of an insulating film 27 covering the lower surface of the semiconductor substrate 11.

Generally, the active region 20 is a region where an active element such as a transistor or a diode is formed. In this embodiment, a bipolar transistor is formed in the active region 20. A MOSFET, an IC, an LSI or the like may be formed in the active region 20.

A specific structure of the active region 20 is as follows. An $n^+$ type buried layer 12 is provided in an upper portion of the semiconductor substrate 11. On the semiconductor substrate 11, an $n^-$ type epitaxial layer 13 is formed. In a surface of the epitaxial layer 13, a $p^+$ type base region 23 and a collector contact region 21 are formed. In an upper portion of the base region 23, an n type emitter region 25 is formed. The collector contact region 21 is formed to extend from the surface of the epitaxial layer 13 to the $n^+$ type buried layer 12. In the embodiment, the epitaxial layer 13 is formed since the description is provided of the bipolar transistor as an example. However, the epitaxial layer may be omitted in the case where a MOSFET is formed in the active region 20.

The base region 23, the collector contact region 21 and the emitter region 25, which are mentioned above, are respectively connected to a base electrode 26B, a collector electrode 26C and an emitter electrode 26E. Each of the regions is connected to each of the electrodes via an opening provided in an insulating film 14 covering the upper surface of the epitaxial layer 13. Moreover, the base electrode 26B, the collector electrode 26C and the emitter electrode 26E extend to the outer side of the trench 24 by rewiring or the like, and these electrodes are thus connected respectively to the through-hole electrodes 16. Although FIG. 1A shows that only the emitter electrode 26E is connected to the through-hole electrode 16, the base electrode 26B and the collector electrode 26C are respectively connected to the unillustrated through-hole electrodes, and may extend up to the lower surface of the semiconductor substrate 11.

The trench 24 extend from the surface of the epitaxial layer 13 to the semiconductor substrate 11, and the insulating film 14 is embedded inside the trench 24. The trench 24 is formed to surround the active region 20, thereby isolating the active region 20 from active regions of other elements. In this embodiment, the active region 20 is isolated from the active regions of the other elements by use of a trench structure, but the active region 20 may be isolated by use of an LOCOS (Local Oxidation of Silicon) oxide film or a p-n junction. Alternatively, an oxide film may be formed on a surface of the trench 24 to fill polysilicon therein, whereby isolating the active region 20. The isolation by use of the LOCOS oxide film can be applied to a case of a MOS type or a Bi-CMOS type, while the isolation by use of the p-n junction can be applied to a case of a BIP type.

The upper and lower surfaces of the semiconductor substrate 11 are covered respectively with the insulating films 14 and 27 each including a silicon oxide film, a silicon nitride film or a insulating resin film. The openings are provided in the insulating film 14 covering the upper surface of the semiconductor substrate 11 so as to partly expose the emitter region 25, the base region 23 and the collector contact region 21, which are provided in the active region 20. In addition, the insulating film 27 covers the entire lower surface of the semiconductor substrate 11 except a portion from which the through-hole electrode 16 juts out.

The through-hole electrode 16 is formed of a conductive material embedded inside a through hole 15 which is formed to pass through the semiconductor substrate 11, the epitaxial layer 13 and the insulating films 14 and 27. The two-dimensional position where the through-hole electrode 16 is formed is located at the outer side of the trench 24. In addition, the bottom end of the through-hole electrode 16 juts out of the insulating film 27 covering the lower surface of the semiconductor substrate 11. The specific length of a jutting portion of the through-hole electrode 16 is approximately several μm to several tens μm (for instance, 20 μm). A two-dimensional shape of the through-hole electrode 16 is a circle or a polygon such as a rectangle, and a width of the through-hole electrode 16 in cross section is approximately 30 μm to 40 μm. In the two-dimensional view, a number of the through-hole electrodes 16 are formed so as to surround the trench 24.

Furthermore, the through-hole electrodes 16 can be formed of a metal film formed integrally with the emitter electrode 26E which is formed on the upper surface of the semiconductor substrate 11, or the like. In a case where a surface of a semiconductor chip includes an IC, an LSI, a system LSI or the like, which is generally used, a plurality of layers of metal films are formed. In this case, although a through-hole electrode and an emitter electrode, for instance, may be electrically connected to each other, different types of materials are sometimes used respectively for the through-hole electrode and the emitter electrode. However, the metal materials constituting the through-hole electrode 16 may include the material same as the one used for the electrodes and interconnects formed on a top layer.

For instance, in a case where Cu is embedded in the top layer by Cu plating by use of a so-called damascene method, firstly Ti, and then TiN layers are formed as barrier films in this order from a lower layer. In this case, the barrier films are inevitably exposed on the jutting portion of the through-hole electrode 16. However, by taking into consideration soldered connection on the jutting portion, it is convenient that Cu is exposed on this portion, in general. Hence, it is preferable that the barrier films exposed on the jutting portion be removed by plasma-etching or sputtering after the jutting portion is formed.

A side wall insulating film 17 is formed between a side wall of the through hole 15 and the through-hole electrode 16. A silicon oxide film or a silicon nitride film having a thickness of approximately several μm is adopted as the side wall insulating film 17. Here, the side wall insulating film 17 may not be formed between the semiconductor substrate 11 and the through-hole electrode 16, since the semiconductor substrate 11 is isolated from the active region 20 (element region) with the trench 24 and the buried layer 12.

The through-hole electrode 16 may have a shape other then the film shape formed on the inner wall of the through hole 15. For instance, the through-hole electrode 16 may be formed by completely filling a conductive material in the through hole 15. In this case, the through hole 15 can be filled with metal by filling-plating. Alternatively, the through hole 15 may be filled with metal such as solder or conductive paste.

In the embodiment, an external electrode is formed of the through-hole electrode 16 which downwardly juts out of the lower surface of the semiconductor substrate 11. Accordingly, in a case where the semiconductor device 10A is mounted on a mounting board by use of a bonding material such as solder or conductive paste, the jutting portion of the through-hole electrode 16 is embedded in the bonding material. Thereby, bonding strength between the through-hole electrode 16 and the bonding material is improved, and hence the connection reliability against the thermal stress or the like is improved.

By referring to FIG. 1B, a structure of a semiconductor device 10B of another mode will be described. In this mode, a concave portion 28 is formed by recessing a lower portion, which is close to the bottom end, of an inner wall of the through hole 15. This structure is formed by over-etching of the inner wall of the through hole 15. A width of the lower portion of the through hole 15 in which the concave portion 28 is provided is larger than that of the other portion of the through hole 15. By forming the through-hole electrode 16 in the through hole 15 including the concave portion 28 as well, an anchor effect occurs between the through-hole electrode 16 and the inside of the through hole 15. Hence, this structure prevents the through-hole electrode 16 from separating from the semiconductor substrate 11.

Figure 2:
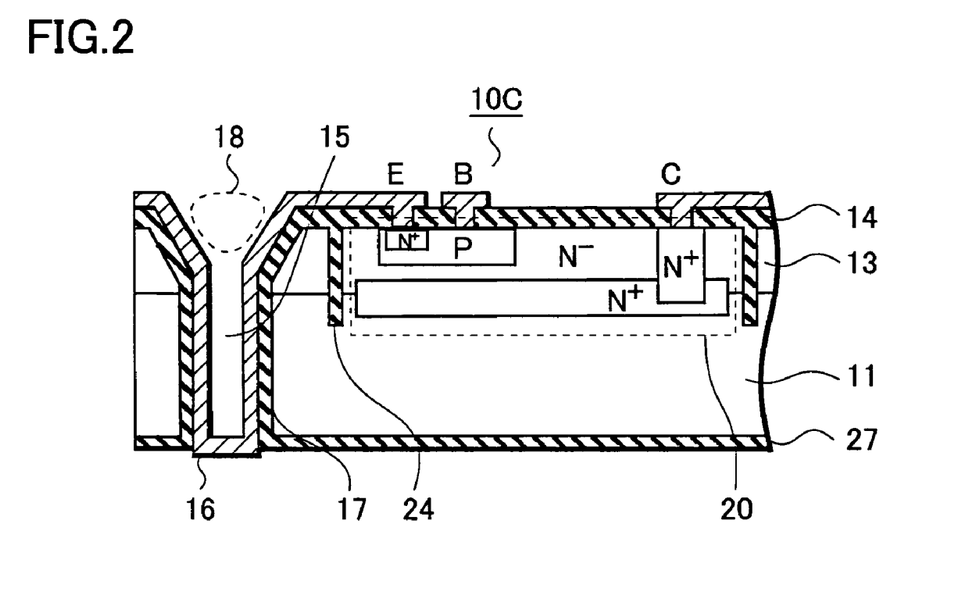
FIG. 2 is a cross-sectional view illustrating the semiconductor device of the first embodiment of the present invention.

By referring to FIG. 2, descriptions will be provided for a structure of a semiconductor device 10C of another mode. In the semiconductor device 10C, an opening 18 is formed by making a width of an upper end of a through hole 15 larger, and thereby the opening 18 has a funnel-like shape viewed in cross section. When the opening 18 is formed by etching, etching condition is set for isotropic etching. Then, the opening 18 having the larger width can be formed by isotropic dry etching. Alternatively, the opening 18 can be formed by isotropic wet etching. In a case where semiconductor devices are stacked in a thickness direction, the opening 18 contributes to connection between the semiconductor devices.

Figure 3:
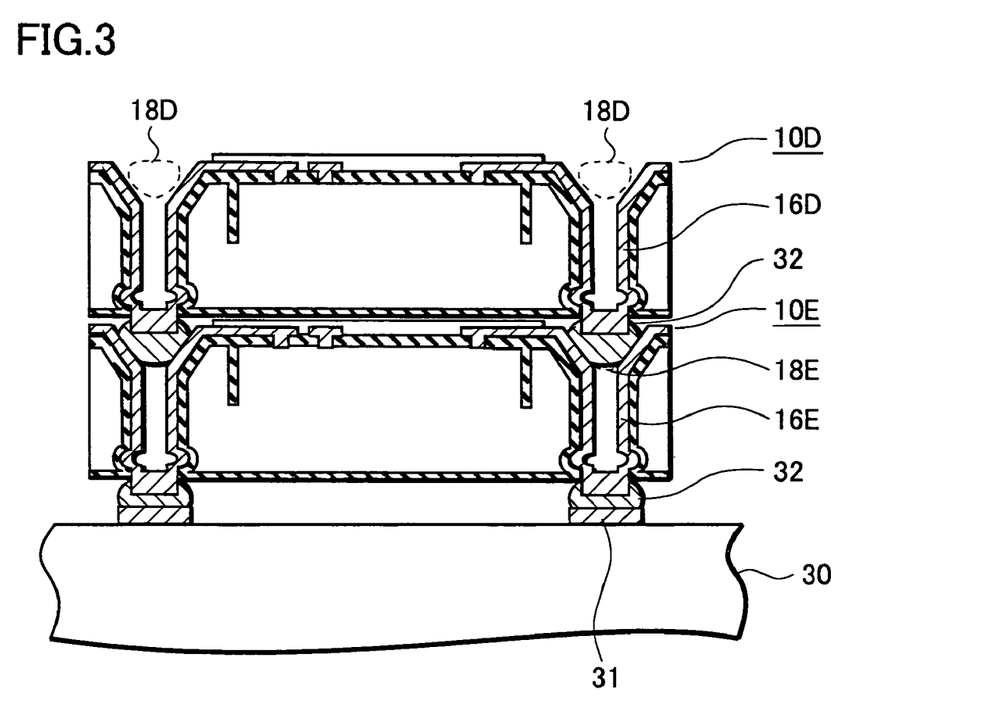
FIG. 3 is a cross-sectional view illustrating the semiconductor device of the first embodiment of the present invention.

As understood from FIG. 3, each of jutting through-hole electrodes 16D is positioned above each of openings 18E having a larger width. Thus, even when the jutting through-hole electrode 16D is placed out of the exact position, the opening 18 has the width large enough to alleviate a problem caused by the displacement of the trough-hole electrode 16D.

By referring to FIG. 3, descriptions will be provided for a structure in which semiconductor devices 10D and 10E each including openings 18 shown in FIG. 2 are stacked.

A lower semiconductor device 10E is mounted on conductive paths 31 formed on a main surface of a mounting board 30 by using bonding materials 32 such as solder. Furthermore, the semiconductor device 10D is stacked on an upper portion of the semiconductor device 10E, thereby realizing a stacked structure. By adopting the stacked structure, the semiconductor devices can be connected to each other with the shortest distance in between.

The openings 18E are provided in the lower semiconductor device 10E. Each of the openings 18E is formed in the funnel-like shape, and thereby has the larger width. Bottom ends of the through-hole electrodes 16D, which are provided to the upper semiconductor device 10D, extend respectively to the insides of the openings 18E of the lower semiconductor device 10E. The bottom ends of the through-hole electrodes 16D are fixed respectively to through-hole electrodes 16E of the lower semiconductor device 10E with the bonding materials 32 such as solder interposed in between. The semiconductor devices 10D and 10E are stacked in this manner, and thus are electrically connected.

Bonding strength between the through-hole electrodes 16D and the openings 18E is increased since the bottom ends of the through-hole electrodes 16D, which are provided to the upper semiconductor device 10D, extend respectively to the insides of the openings 18E provided to the lower semiconductor device 10E. Hence, connection reliability of connecting portions between the through-hole electrodes 16D against the thermal stress is increased.

Here, two semiconductor devices each having through-hole electrodes are stacked, but it is possible to stack three or more semiconductor devices. In this case as well, the connection reliability between the semiconductor devices is increased by providing the openings 18E each having a large width.

In addition, the bottom ends of the through-hole electrodes 16E of the lower semiconductor device 10E jut out, and are embedded in the bonding materials 32. Since the through-hole electrodes 16E are embedded in the bonding materials 32, the bonding strength between the through-hole electrodes 16E and the bonding materials 32 is improved. Thus, the connection reliability against an external force such as the thermal stress is improved.

The point herein is the jutting through-hole electrodes 16E directly connected to the mounting device 30. The through-hole electrodes 16E are affected by thermal expansion of the mounting board 31, whereby causing a problem that a crack or the like occurs in the connecting portions. For this reason, the stress can be reduced by making larger the jutting portions of the through-hole electrodes 16E provided to the lower semiconductor device 10E jut than those of the other through-hole electrodes. As described by referring to FIG. 3, the more the through-hole electrodes 16E jut out, the more the thermal stress can be reduced by using the through-hole electrodes 16E.

Second Embodiment

In a second embodiment, by referring to FIGS. 4A to 5B, descriptions will be provided for a method of manufacturing the semiconductor device 10A illustrated in FIG. 1A.

Figure 4A:
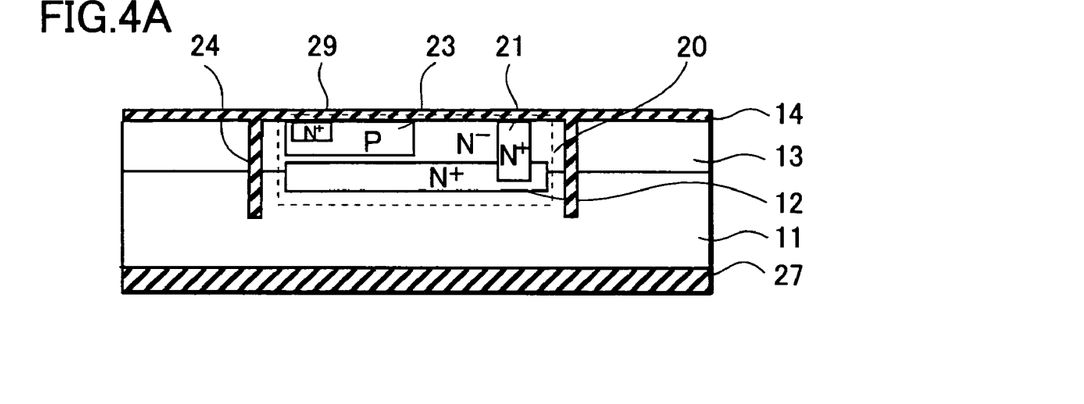
FIGS. 4A to 4C are cross-sectional views of the semiconductor device of a second embodiment of the present invention for showing a method of manufacturing the semiconductor device.

By referring to FIG. 4A, first, an active region 20 including a bipolar transistor is formed in an upper surface of a p type semiconductor substrate 11 having a thickness of approximately 600 μm.

A method of manufacturing the active region 20 is as follows. First, an $n^+$ type buried layer 12 is provided in the upper surface of the semiconductor substrate 11 by ion implantation. Subsequently, an $n^-$ epitaxial layer 13 is formed on the upper surface of the semiconductor substrate 11. The epitaxial layer 13 has a thickness of approximately 1.5 μm. Thereafter, a collector contact region 21, a base region 23 and an emitter region 29 are formed by ion implantation. The collector contact region 21 is formed to reach the buried layer 12 by adopting phosphorus ions (P) as an ion species used in the ion implantation. The base region 23 is formed by adopting boron ions (B) as the ion species. The emitter region 29 is formed by adopting phosphorus ions (P) as the ion species.

After the active region 20 is formed, a trench 24 is formed to surround the active region 20. Thereafter, the trench 24 is filled with an oxide film. The trench 24 is formed by dry etching using an etching gas containing $SF_6$, $O_2$, $C_4F_8$ or the like. The trench 24 is formed to reach the semiconductor substrate 11, and has a depth, for instance, of approximately 3.5 μm. In place of the trench 24, an LOCOS oxide film or p-n junction may surround the active region 20. Furthermore, in one of the following steps of forming through holes 15, the through holes 15 and the trench 24 may be simultaneously formed.

An upper surface of the epitaxial layer 13 is covered with an insulating film 14. Similarly, a lower surface of the semiconductor substrate 11 is covered with an insulating film 27. Each of the insulating films 14 and 27 has a thickness of approximately 1 μm to 5 μm.

Figure 4B:
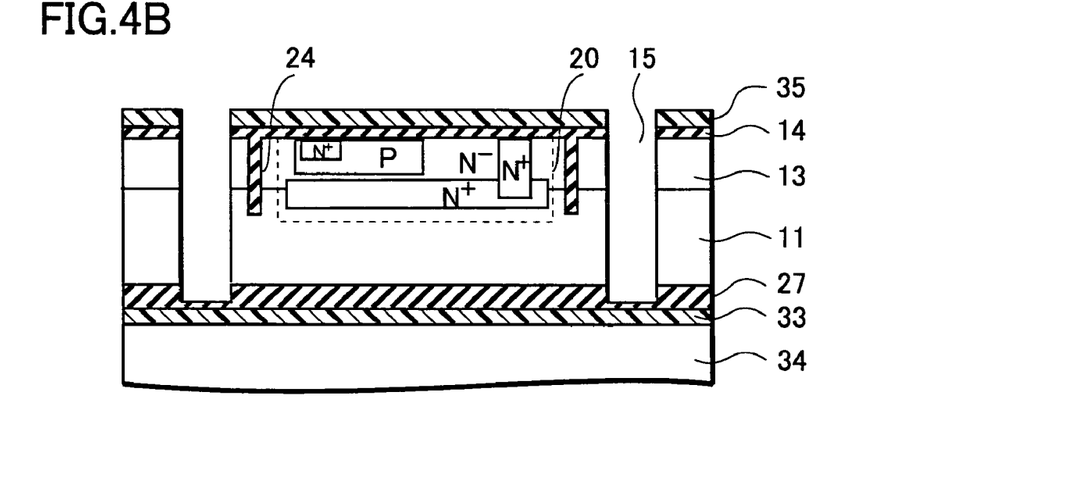

By referring to FIG. 4B, subsequently, the through holes 15 which passes through the semiconductor device 11 to reach the insulating film 27 are formed. Specifically, an etching-resistant mask 35 is formed to cover an upper surface of the insulating film 14 except regions in which the through holes 15 are to be formed. A photoresist may be used as the mask 35. Each of openings provided in the mask 35 has a width of approximately 30 μm to 40 μm. Furthermore, the semiconductor substrate 11 is attached to a supporting substrate 34 such as a glass substrate with an adhesive layer 33 interposed in between, the adhesive layer 33 made of an epoxy resin or the like.

The through holes 15 are formed by dry etching from an upside by using the mask 35, thereby passing through the semiconductor substrate 11 to reach the insulating film 27. In this step, the insulating film 14 formed of a silicon nitride film or a silicon oxide film is etched first, and then the epitaxial layer 13 and the semiconductor substrate 11, which are made of silicon, are etched. Thereafter, the insulating film 27 formed of a silicon nitride film or a silicon oxide film is etched partway in a thickness direction. An etching depth of the insulating film 27 is approximately 1 μm to 4 μm. By forming the through holes 15 so as to extend partway in the thickness direction in the insulating film 27 as described, through-hole electrodes 16 can be formed so as to jut out as illustrated in FIG. 1A.

In this step, the insulating film 14, the epitaxial layer 13, the semiconductor substrate 11 and the insulating film 27, all of which have different compositions, are partially removed by dry etching using the etching gas. In this embodiment, the insulating film 14, the epitaxial layer 13, the semiconductor substrate 11 and the insulating film 27 may be collectively etched by use of a single etching gas. Alternatively, different etching gases may be used depending on compositions of members to be etched.

In the case where the different etching gases are used depending on the compositions of the members to be etched, the etching gases to be used are chosen as follows. Specifically, a mixed gas of $CF_4$ and $O_2$ or a mixed gas of $CF_6$ and $O_2$ is used to etch the epitaxial layer 13 and the semiconductor substrate 11 which are made of silicon. $CHF_4$, $C_2F_6$ or a mixed gas of $CF_4$ and $H_2$ is used to etch the insulating layers 14 and 27 which are made of the silicon oxide film or a silicon nitride film.

Figure 4C:
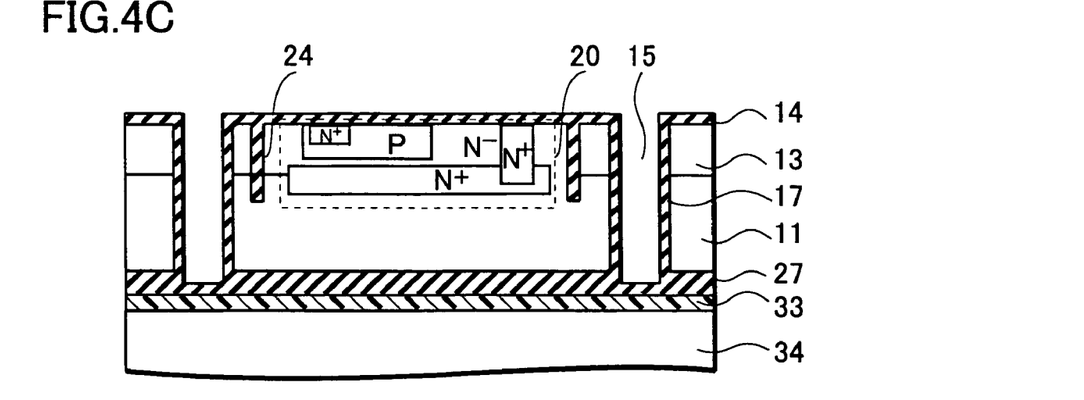

By referring to FIG. 4C, subsequently, side wall insulating films 17 are formed, of the silicon oxide film or a silicon nitride film, on side walls of the through holes 15. Thermal oxidation method, CVD (Chemical Vapor Deposition) method or the like is adopted to form the side wall insulating films 17.

Figure 5A:
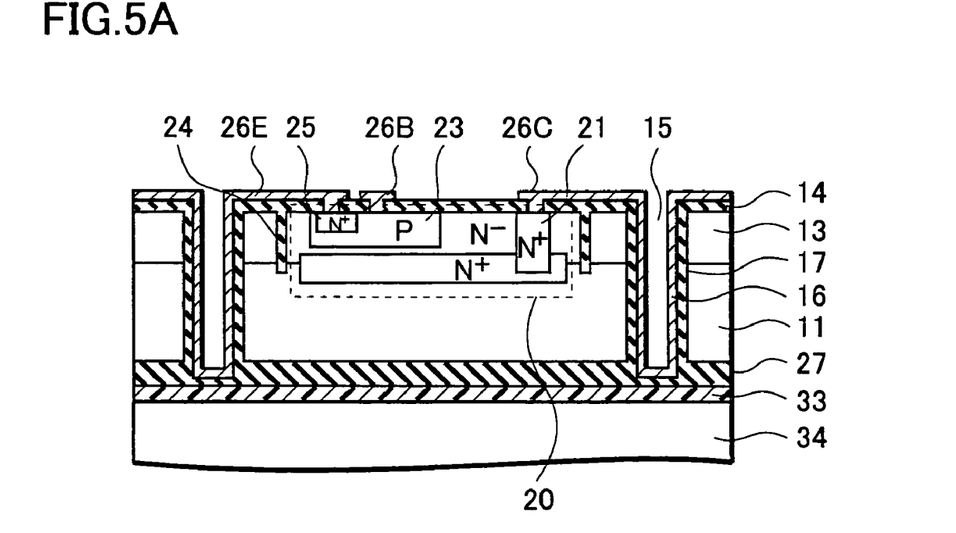
FIGS. 5A and 5B are cross-sectional views of the semiconductor device of the second embodiment of the present invention for showing the method of manufacturing the semiconductor device.

By referring to FIG. 5A, next, metal films are formed to cover the inner walls of the through holes 15 and the insulating film 14. In this step, each of the metal films is formed of a barrier film, a seed film and a plating film. The barrier film is made of titanium (Ti), titanium nitride (TiN), titanium tungsten (TiW), tantalum nitride (TaN) or the like, and is formed by using a sputtering method, the CVD method or the like. On the upper surface of the barrier layer, the seed film is formed, of a metal film having a thickness of approximately several hundreds nm, by using the sputtering method, the CVD method or the like. Thereafter, the plating film is formed by using the seed film as an electrode, and thus the metal film having a thickness of approximately several μm is formed. The metal film thus formed is patterned by wet etching or the like, and thereby has a predetermined pattern. Otherwise, the through-hole electrodes 16 may be formed by embedding a conductive material inside the through holes 15.

Prior to this step, upper portions of an emitter region 25, a base region 23 and a collector contact region 21 are exposed to an outside from openings provided in the insulating film 14. An emitter electrode 26E, a base electrode 26B and a collector electrode 26C connecting respectively to the emitter region 25, the base region 23 and the contact region 21 are formed as well. Furthermore, each of the above electrodes is connected to each of the through-hole electrodes 16. Although FIG. 5 shows that only the emitter and the collector electrode 26E and 26C are connected to the through-hole electrodes 16, the base electrode 26B is connected to another through hole 16 as well in actual.

After the completion of the above-described step, a passivation film (not illustrated) is formed to cover the emitter electrode 26E, the base electrode 26B and the collector electrode 26C. Furthermore, the semiconductor substrate 11 is removed from the supporting substrate 34.

Figure 5B:
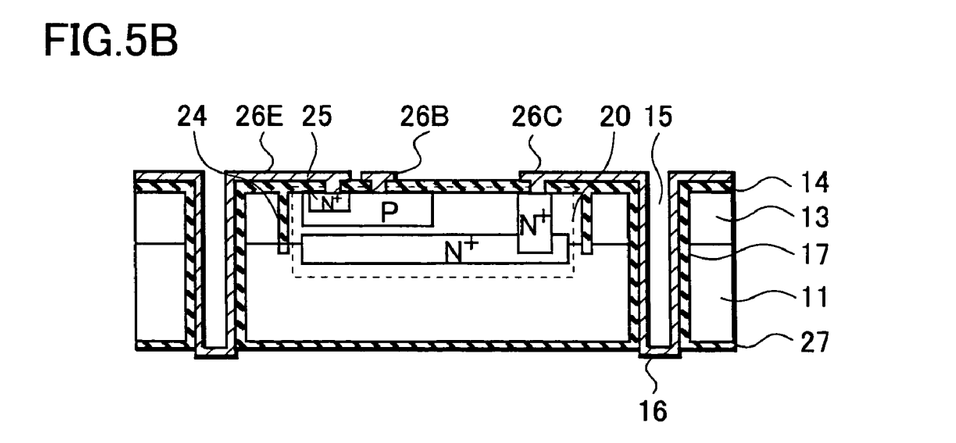

By referring to FIG. 5B, subsequently, the insulating film 27 covering the lower surface of the semiconductor substrate 11 is etched, and thereby bottom ends of the through-hole electrodes 16 jut out of the insulating film 27. Specifically, the bottom ends, which are formed to be embedded in the insulating film 27, of the through-hole electrodes 16 jut out by dry etching of the entire lower surface of the insulating film 27. In this step, $CHF_4$, $C_2F_6$ or a mixed gas of $CF_4$ and $H_2$ is used as an etching gas since the insulating film 27 to be etched is made of the silicon oxide film or the silicon nitride film.

This step reduces a thickness of the insulating film 27 to approximately 1 μm to 5 μm, for instance. A jutting potion in the bottom end of each of the through-hole electrodes 16 is, for instance, approximately 1 μm to 4 μm in length.

As described above, the metal film adopted as the barrier film may be removed by etching or sputtering if the metal film is unnecessary when using solder bonding or the like.

In addition, since a plurality of semiconductor devices are formed on a single semiconductor wafer (not illustrated) in the steps described above, the semiconductor wafer is diced to obtain separated semiconductor devices.

The semiconductor device 10A illustrated in FIG. 1A is thus manufactured in the steps described above.

Third Embodiment

Figure 1B:
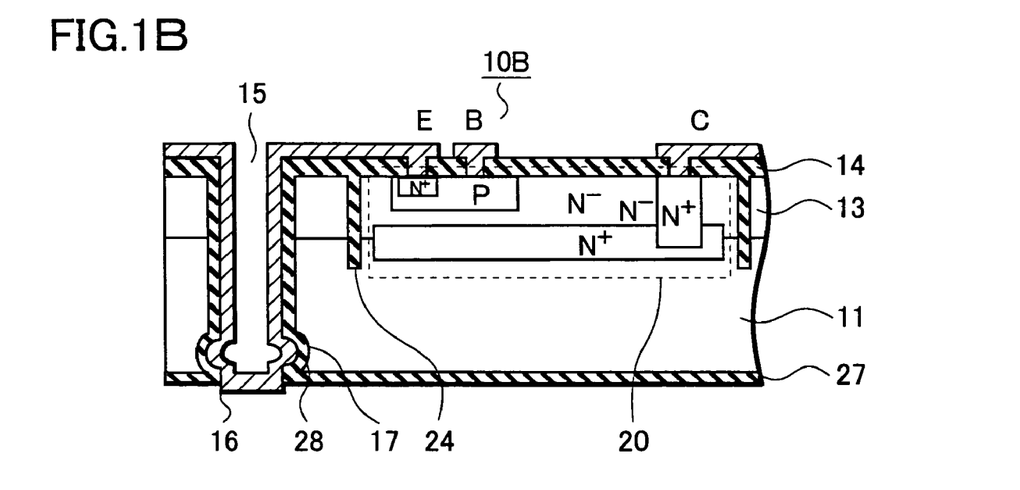

In a third embodiment, by referring to FIGS. 6A to 6D, descriptions will be provided for a method of manufacturing the semiconductor device 10B having a structure shown in FIG. 1B. The manufacturing method of this embodiment is basically similar to that of the second embodiment described above, and it is a different point that a concave portion 28 is provided to each through hole. Hereinafter, the manufacturing method will be described, focusing on this point.

Figure 6A:
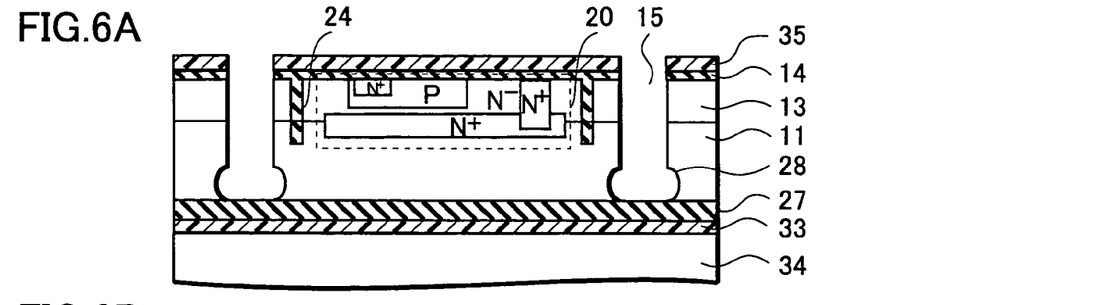
FIGS. 6A to 6D are cross-sectional views of the semiconductor device of a third embodiment of the present invention for showing the method of manufacturing the semiconductor device.

By referring to FIG. 6A, an active region 20 is provided in a surface of a semiconductor substrate 11, and then, through holes 15 are formed to pass through a group including the semiconductor substrate 11 and layers stacked on the semiconductor substrate 11. In this embodiment, the concave portion 28 is formed in a bottom end of each of the through holes 15, the bottom end being the lowermost portion of the semiconductor substrate 11. In the bottom end of each of the through holes 15, the concave portion 28 is formed, and thereby the bottom end has a barrel-like shape and a larger width than that of the other portion of the through hole 15.

The concave portions 28 can be formed respectively in the lowermost portions of the semiconductor substrate 11 by over etching. In this embodiment, different etching gases are used for etching respectively the semiconductor substrate 11 made of silicon, and an insulating film 27 made of a silicon oxide film or a silicon nitride film. An etching gas such as a mixed gas of $CF_4$ and $O_2$ or a mixed gas of $CF_6$ and $O_2$ is used for etching the semiconductor substrate 11 made of silicon. This etching gas has a lower etching rate to the insulating film 27. Thereby, once the through holes 15 pass through the semiconductor substrate 11 to reach the insulating film 27 with progress in etching, the etching progresses in lateral directions to form the concave portions 28. In addition, the concave portions 28 may also be formed by using the lower etching rate to the surface of the insulating film 27, even when a single etching gas is used for dry etching in place of the mixed gas.

Figure 6B:
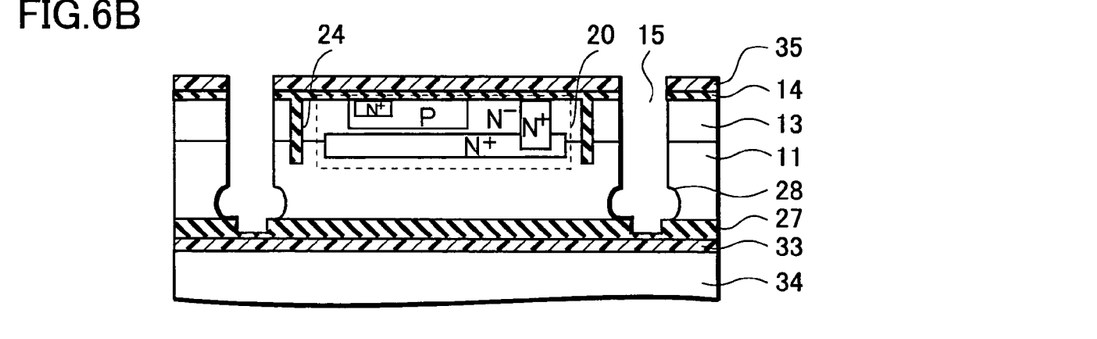

By referring to FIG. 6B, subsequently, the through holes 15 are extended partway in a thickness direction in the insulating film 27, by dry etching further. Here, $CHF_4$, $C_2F_6$, a mixed gas of $CF_4$ and $H_2$ or the like, is used for etching the insulating films 14 and 27 made of the silicon oxide film or the silicon nitride film.

Figure 6C:
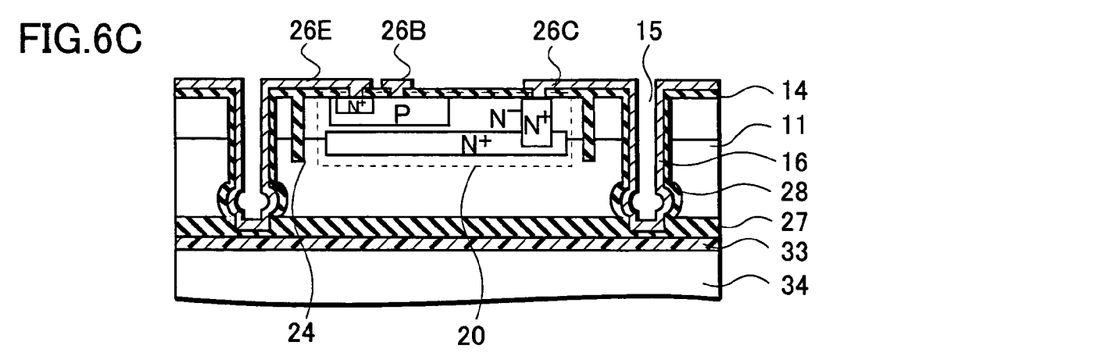

In reference to FIG. 6C, a metal film is formed both on the surface of the insulating film 14 and on the inner walls of the through holes 15, and then, the metal film is patterned. A through-hole electrode 16, an emitter electrode 26E, a base electrode 26B and a collector electrode 26C are formed of the metal film formed as described above. In this embodiment, each of the through-hole electrodes 16 is also formed even in the concave portion 28 provided in each of the through hole 15. Hence, adherence strength between the through-hole electrode 16 and the inner walls of the through hole 15 is increased.

Figure 6D:
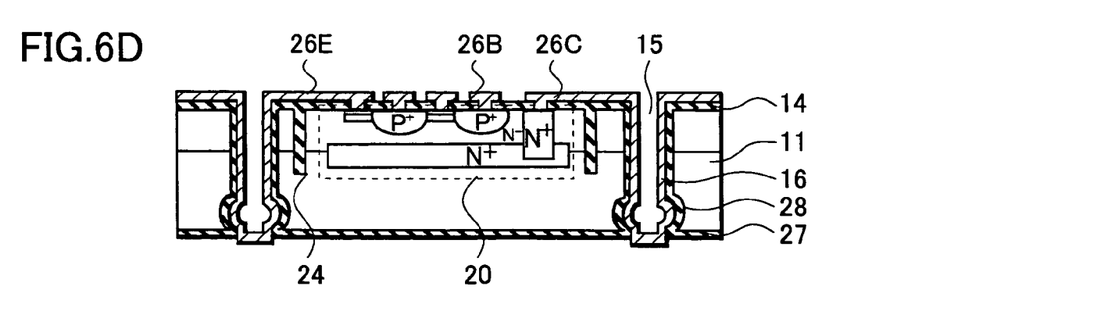

Furthermore, by referring to FIG. 6D, the entire surface of the insulating film 27 is removed by dry etching from the lower side to an extent that the bottom ends of the trough-hole electrode 16 downwardly jut out of the insulating film 27. As a result, the bottom ends of the through-hole electrodes 16 jut out of the insulating film 27.

The semiconductor device 10B illustrated in FIG. 1B is manufactured in the steps described above.

Fourth Embodiment

Figure 7A:
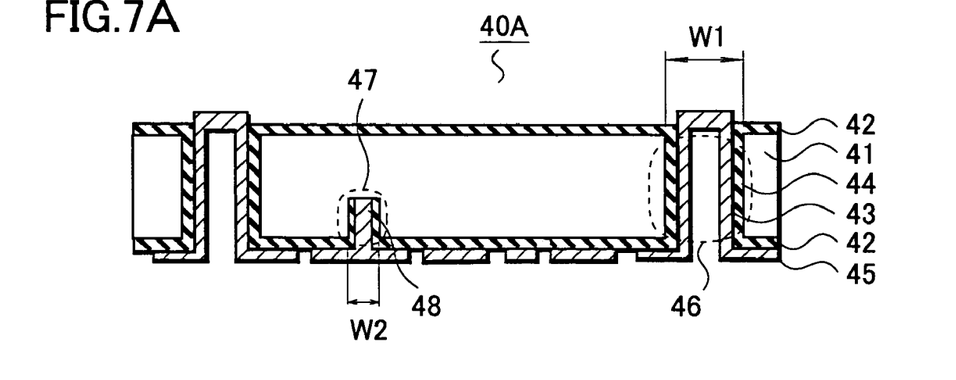
FIGS. 7A to 7C are cross-sectional views illustrating a circuit board of a forth embodiment of the present invention.
Figure 7B:
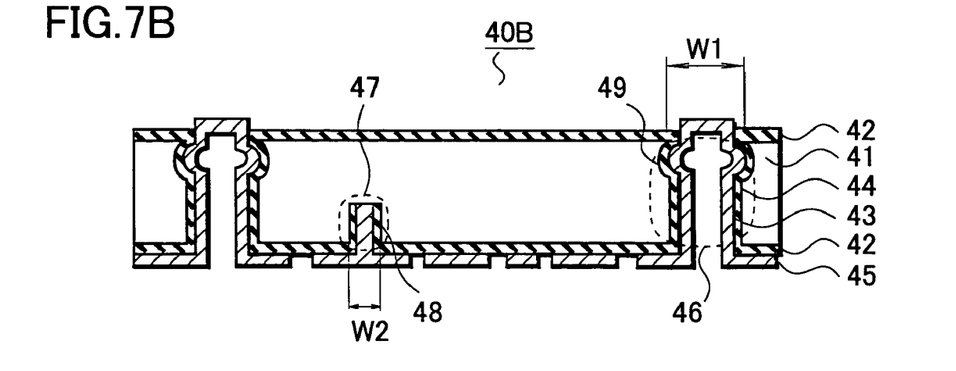
Figure 7C:
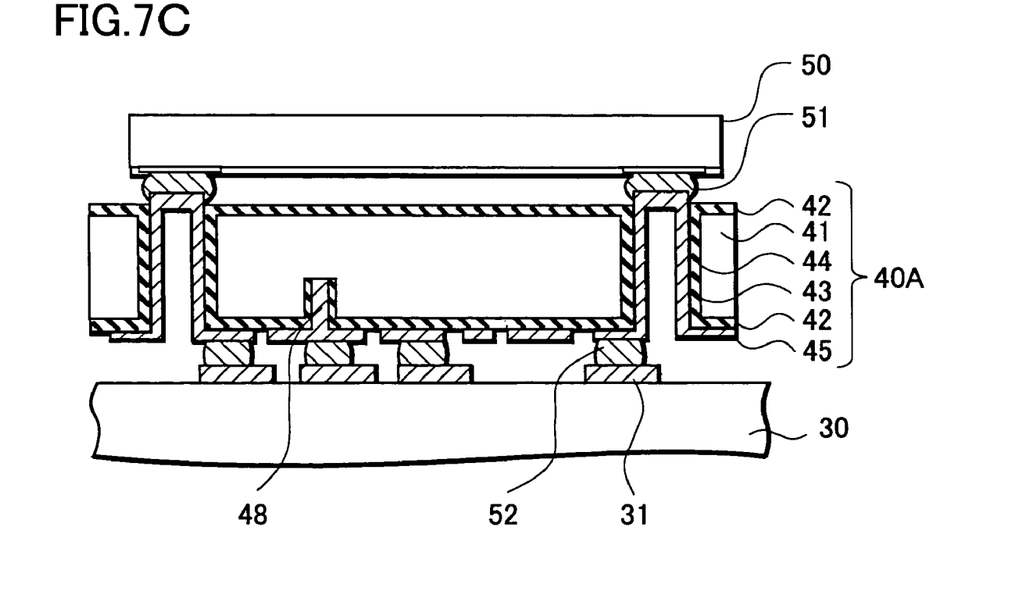

In a fourth embodiment, by referring to FIGS. 7A to 7C, descriptions will be provided for a structure of a circuit board including through-hole electrodes 43 which jut out of the circuit board. The circuit board described in this embodiment can be used as an interposer. An interposer is a board which is arranged between a mounting board and a circuit element such as a semiconductor element, and which is used for constituting a circuit device or the like. The circuit board of this embodiment and a method of manufacturing the same are basically similar to those of the other embodiments described above, and thus descriptions of the same parts will be omitted.

As illustrated in FIG. 7A, a circuit board 40A of this embodiment includes: a semiconductor substrate 41 made of silicon; a conductive pattern 45 formed on a lower surface (first surface) of the semiconductor substrate 41; and the through-hole electrodes 43 each connected to the conductive pattern 45 and each passing through the semiconductor substrate 41. In the circuit board 40A, top ends of the through-hole electrodes 43 jut out of the semiconductor substrate 41.

The semiconductor substrate 41 is made of a semiconductor such as silicon and has a thickness of approximately 100 μm to 200 μm, for instance. An intrinsic semiconductor or an impurity semiconductor can be used as a material of the semiconductor substrate 41. The impurity semiconductor to be used includes a p type semiconductor to which p type impurities such as boron are introduced, or an n type semiconductor to which n type impurities such as phosphorous are introduced. By using the impurity semiconductor as the material of the semiconductor substrate 41, electric resistance of the semiconductor substrate 41 becomes lower, thereby facilitating a current flow. Accordingly, conduction between a connecting electrode 48 and the semiconductor substrate 41 can be facilitated.

An insulating film 42 is formed of a silicon oxide film, a silicon nitride film or a resin film such as polyimide, and covers an upper surface and the lower surface of the semiconductor substrate 41. The conductive pattern 45 and the semiconductor substrate 41 are insulated from each other with the insulating film 42. In addition, side wall insulating films 44 cover side surfaces of through holes 46. A side wall of a connecting hole 47 is covered with the insulating film 42, while the bottom surface of the connecting hole 47 is not covered with the insulating film 42, and the semiconductor substrate 41 is exposed to the top surface of the connecting hole 47.

The conductive pattern 45 is formed on the insulating film 42 covering the lower surface of the semiconductor substrate 41. The conductive pattern 45 forms pads (for instance, die pads or bonding pads), to which conductive paths, semiconductor elements and the like on the mounting board are connected, and interconnects which connects the pads to each other. In other words, in this embodiment, the top ends of the through-hole electrodes 43 jut out of the upper surface of the semiconductor substrate 41, and the conductive pattern 45 connected to the through-hole electrodes 43 is formed on the lower surface of the semiconductor substrate 41. Here, a conductive pattern connected to the through-hole electrode 43 may be also formed on the upper surface of the semiconductor substrate 41.

Although a single layer of the conductive pattern 45 is formed in this embodiment, multiple layers of the conductive pattern 45 may be formed as well.

The through-hole electrodes 43 are made of a conductive material provided in the through hole 46 which is formed to pass through the semiconductor substrate 41 in a thickness direction. The through-hole electrode 43 is formed to extend continuously from the conductive pattern 45 provided on the lower surface of the semiconductor substrate 41. The through-hole electrodes 43 and the semiconductor substrate 41 are insulated from each other with the side wall insulating films 44 provided to the inner walls of the through holes 46. In this embodiment, each through-hole electrode 43 made of a metal film having a thickness of approximately several micrometers is formed on the inner wall of each through hole 46 having a width (W1) of approximately 40 μm. Alternatively, the through-hole electrodes 43 may be formed of a conductive material embedded in the through hole 46.

The connecting electrode 48 is formed of a conductive material embedded in the connecting hole 47 extending from the lower surface of the semiconductor substrate 41 partway in the thickness direction in the semiconductor substrate 41. An end of the connecting electrode 48 is brought in ohmic contact with the semiconductor substrate 41 exposed to the top surface of the connecting hole 47, and thereby, the connecting electrode 48 and the semiconductor substrate 41 are electrically connected. The connecting electrode 48 has a function of electrically connecting the conductive pattern 45 and the semiconductor substrate 41. A width W2 of the connecting electrode 48 is preferably equal to or smaller than that of the through-hole electrode 43, and is set at, for instance, approximately 40 μm to 10 μm. A depth of the connecting electrode 48 may be to an extent that the connecting electrode 48 does not pass through the semiconductor substrate 41, and the depth is set at, for instance, approximately 50 μm to 100 μm. In addition, the connecting electrode 48 can be also made of a metal film which is formed integrally with the conductive pattern 45. Furthermore, the connecting electrode 48 may be formed by filling the conductive material in the connecting hole 47.

Parasitic capacitance generated between the conductive pattern 45 and the semiconductor substrate 41 can be reduced by electrically connecting the conductive pattern 45 and the semiconductor substrate 41 via the connecting electrode 48. Furthermore, by connecting the semiconductor substrate 41 to a constant electric potential (ground potential or power supply potential), the electric potential of the semiconductor substrate 41 is prevented from fluctuating. Moreover, a shielding effect of the semiconductor substrate 41 can be improved as well.

As in the case of the first embodiment described above, the top ends of the through-hole electrodes 43 jut out of the upper surface of the insulating film 42 covering the semiconductor substrate 41, and thus respective external electrodes (pads) are formed. For example, a jutting portion of each of the through-hole electrodes 43 is approximately several μm to several tens μm in thickness. Since the jutting external electrodes are formed respectively in the through-hole electrodes 43, the through-hole electrodes 43 can be embedded in a bonding material such as solder. Hence, this provides an advantage that the connection reliability between the through-hole electrodes 43 and bonding material is improved.

By referring to FIG. 7B, a structure of a circuit board 40B of another mode will be described. The basic structure of the circuit board 40B is similar to that of the circuit board 40A described above. The different point is that concave portions 49 are provided respectively to the through holes 46. Here, each of the concave portions 49 is formed by recessing a portion, which is close to the top end, of an inner wall of each of the through holes 46. A recessed depth of the concave portion 49 is approximately several μm. Since the concave portion 49 is provided to the through hole 46, the through hole 46 is formed to partly have a barrel-like shape and a larger width. Thus, an anchor effect occurs between the through-hole electrode 43 and the through hole 46. As a result, bonding strength between the through hole 46 and the through-hole electrode 43 is improved, thereby preventing the through-hole electrode 43 from separating from the through hole 46.

By referring to FIG. 7C, descriptions will be provided for a mounting structure in which the above-mentioned circuit board 40A is used as an interposer. In this embodiment, a circuit module is configured by mounting a semiconductor element 50 serving as an LSI on a mounting board 30 via the circuit board 40A.

The semiconductor element 50 includes a predetermined electric circuit. By using the flip chip technique, electrodes formed on a lower surface of the semiconductor device element 50 are mounted on the circuit board 40A with bonding materials 51 such as solder. Since both of the semiconductor element 50 and the circuit board 40A are made of silicon, thermal stress is seldom or never applied to the bonding materials 51 connecting the semiconductor element 50 and the circuit board 40A. Accordingly, the bonding material 51 has very high connection reliability against the thermal stress.

As described, the top ends of the through-hole electrodes 43 jut out of an upper surface of the insulating film 42 covering the upper surface of the semiconductor substrate 41, and each of the jutting portions thereof is several μm in thickness. Accordingly, by embedding the top ends of the through-hole electrodes 43 respectively in the bonding materials 51, connection reliability between the through-hole electrode 43 and the bonding material 51 becomes very high.

The conductive pattern 45 formed on the lower surface of the circuit board 40A is connected, with bonding materials 52 such as solder, to conductive paths 31 formed on the upper surface of the mounting board 30. In addition, a portion formed to extend continuously from the connecting electrode 48 in the conductive pattern 45 is also connected to the conductive paths 31 with the bonding materials 52. Accordingly, the semiconductor substrate 41 can be connected to an outside constant electrical potential (a ground potential and a power supply potential) via the connecting electrode 48, the conductive pattern 45, the bonding materials 52 and the conductive paths 31.

By referring to FIGS. 8A to 8D, descriptions will be provided below for a method of manufacturing a circuit board 40A described above. FIGS. 8A to 8D are cross-sectional views of the circuit board respectively in steps of manufacturing processes.

Figure 8A:
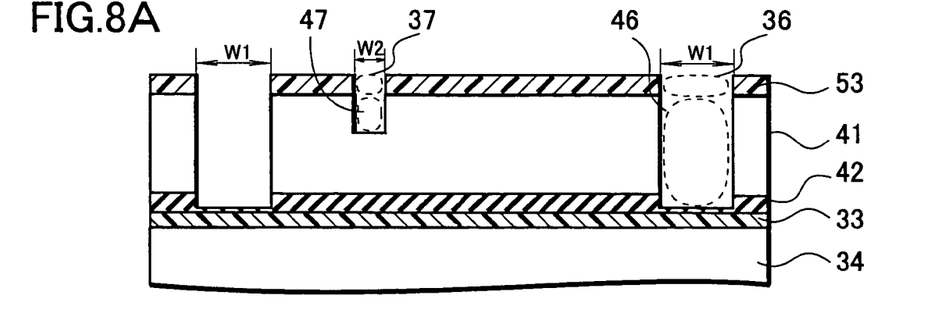
FIGS. 8A to 8D are cross-sectional views illustrating the circuit board of the embodiment of the present invention for showing the method of manufacturing the semiconductor device.

By referring to FIG. 8A, first, through holes 46 and a connecting hole 47 are formed by dry etching a semiconductor substrate 41. In this embodiment, the semiconductor substrate 41 having a thickness of approximately 100 μm to 400 μm is etched in a state where the semiconductor substrate 41 is attached to a supporting substrate 34 with an adhesive layer 33. An upper surface of the semiconductor substrate 41 is selectively covered with an etching resistant mask 53. In other words, the mask 53 is selectively removed in portions where the through holes 46 and the connecting hole 47 are formed, thereby forming openings 36 and 37.

Each of the openings 36 provided to form the through holes 46 has a width larger than that of the opening 37 provided to form the connecting hole 47. Specifically, each of the openings 36 has a width W1 of approximately 40 μm, for instance, and the opening 37 has a width W2 of approximately 20 μm, for instance. In a portion etched from the narrow opening 37, the etching progresses at an etching rate lower than that in portions etched from the wider openings 36. Accordingly, when the semiconductor substrate 41 is etched from the openings 36 until the through holes 46 passing through the semiconductor substrate 41 are formed, the etching from the opening 37 stops partway in the semiconductor substrate 41. Hence, the through holes 46 and the connecting holes 47 respectively having different depths can be formed by dry etching only once.

In this step, the dry etching is performed until an insulating film 42, which covers a lower surface of the semiconductor substrate 41, is partially removed. By partially removing the insulating film 42, the through-hole electrodes 43 can be made to jut out of the insulating film 42 in one of the following steps (refer to FIG. 8D).

It suffices that the etching gas used for dry etching in this step is the same as that in the second embodiment. In other words, the semiconductor substrate 41 and the insulating film 42 may be etched by use of a single etching gas. Alternatively, different etching gases may be used depending on compositions of members to be etched. In addition, concave portions 49 as shown in FIG. 7B may be formed by over-etching lower portions of the semiconductor substrate 41. After completion of this step of etching, the mask 53 is removed from the semiconductor substrate 41.

Figure 8B:
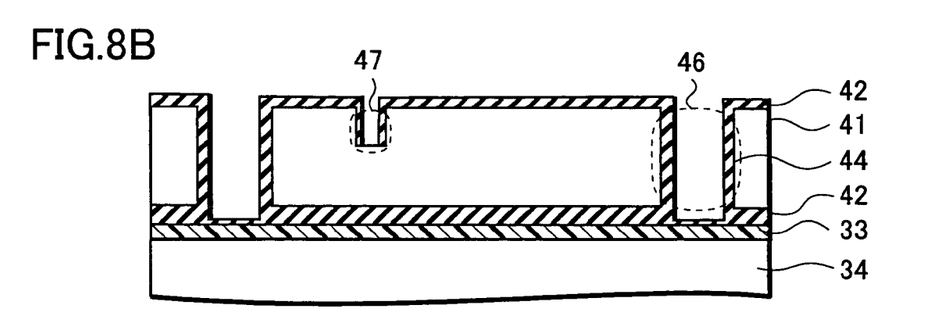

By referring to FIG. 8B, subsequently, the insulating film 42 made of a silicon oxide film or a silicon nitride film is formed on inner walls of the through holes 46, an inner wall of the connecting hole 47, and the upper surface of the semiconductor substrate 41. Thereafter, the insulating film 42 of a portion which covers the bottom surface of the connecting hole 47 is removed by etching or the like.

Figure 8C:
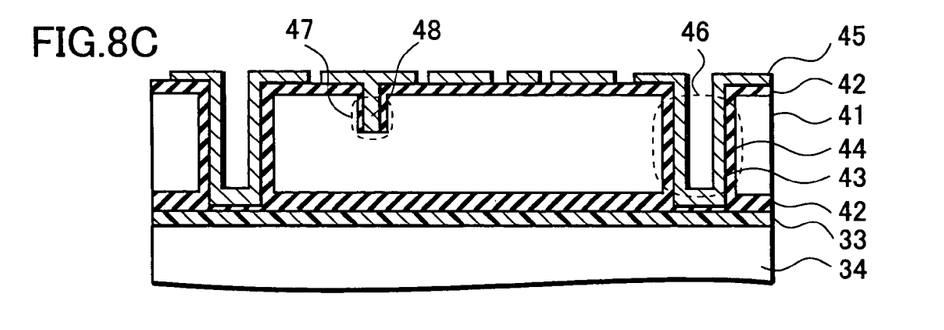

By referring to FIG. 8C, subsequently, a metal film is formed on the upper surface of the semiconductor substrate 41 including the inner walls of the through holes 46 and the connecting hole 47. The metal film is then patterned, and thus a conductive pattern 45 is formed. The metal film described above may be formed of a barrier film, a seed film and a plating film as in the case of the second embodiment. Here, although the through-hole electrodes 43 are formed of the metal film formed on the inner walls of the thorough holes 46, the through-hole electrodes 43 may be formed of a conductive material embedded in the through holes 46. Furthermore, although a connecting electrode 48 is made of a conductive material filled in the connecting hole 47, the connecting electrode 48 may be made of the metal film formed on the inner wall of the connecting hole 47. After completion of the step described above, the semiconductor substrate 41 is removed from the supporting substrate 34.

Figure 8D:
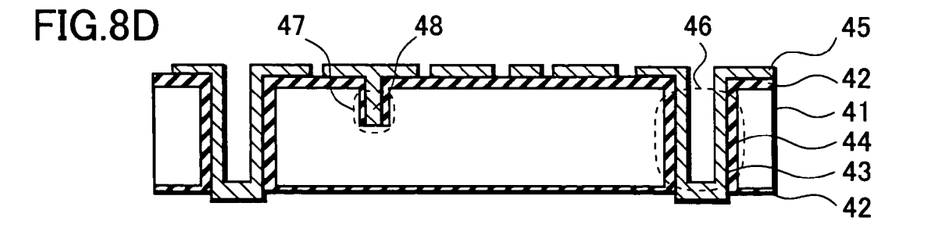

By referring to FIG. 8D, subsequently, the insulating film 42 is removed entirely from a lower surface of the insulating film 42 by dry etching, until bottom ends of the through-hole electrodes 43 are exposed to the outside. By processing this step, the bottom ends of the through-hole electrodes 43 jut out of the lower surface of the insulating film 42 by approximately 1 μm to 4 μm.

By processing the above steps, the circuit board 40A (refer to FIG. 7A) including jutting through-hole electrodes 43 is manufactured.

In this embodiment, it is possible to form fine external electrodes by making the through-hole electrodes 43 jut out. Accordingly, steps of forming a plating film and of selectively etching are unnecessary to form the external electrodes. Thus, fine jutting external electrodes can be formed with simplified steps.

In the semiconductor device and the circuit board of the present invention, the through-hole electrode passing through the semiconductor substrate juts out of the first main surface of the semiconductor substrate, and thus functions as an external electrode. A jutting portion of the through-hole electrode is embedded in a bonding material such as solder. Accordingly, an area where the bonding material and the through-hole electrode are in contact becomes larger, whereby improving connection reliability to thermal stress or the like.

Furthermore, the through-hole electrode can be formed as finely as the through-hole electrode has a width of approximately 30 μm to 40 μm. Accordingly, the fine jutting external electrode can be formed of the through-hole electrode on the main surface of the semiconductor substrate.

In addition, the through hole can be partially widened by providing a concave portion to an inner wall of the through hole passing through the semiconductor substrate. This makes it possible to increase adhesion strength between the through hole and the through-hole electrode formed in the through hole.

In the manufacturing method, the through-hole electrode is formed to reach the insulating film covering the second main surface of the semiconductor substrate, and then the insulating film is removed, thereby making the through-hole electrode jut out. For this reason, the present invention does not require a special step to form the jutting external electrode. The step of forming the through-hole electrode also serves as the step of forming the external electrode. Accordingly, the fine jutting external electrode can be formed in the simplified manufacturing method.

What is claimed is:

1. A semiconductor device comprising:
a semiconductor substrate having a through hole penetrating through the semiconductor substrate in a thickness direction thereof;
an active region formed in a first main surface of the semiconductor substrate;
a through-hole electrode formed in the through hole, electrically connected to the active region and extending to reach a second main surface of the semiconductor substrate; and
a trench formed in the semiconductor substrate, filled with an insulating material and surrounding the active region, the through-hole electrode being formed outside an area of the semiconductor substrate surrounded by the trench, wherein an end of the through-hole electrode projects from the second main surface of the semiconductor substrate, and the through hole has a first portion extending from the second main surface and having a vertical sidewall with respect to the first and second main surfaces and has a second portion extending from the first main surface and having a tapered sidewall so as to have a maximum size at the first main surface of the semiconductor substrate.

2. A semiconductor device comprising:

a first semiconductor die comprising a semiconductor substrate having a through hole penetrating through the semiconductor substrate in a thickness direction thereof; an active region formed in a first main surface of the semiconductor substrate, a through-hole electrode formed in the through hole, electrically connected to the active region and extending to reach a second main surface of the semiconductor substrate, and a trench formed in the semiconductor substrate, filled with an insulating material and surrounding the active region, the through-hole electrode being formed outside an area of the semiconductor substrate surrounded by the trench; and a second semiconductor die stacked on the first semiconductor die and comprising a protruding electrode, wherein an end of the through-hole electrode projects from the second main surface of the semiconductor substrate, and the through hole has a first portion extending from the second main surface and having a vertical sidewall with respect to the first and second main surfaces and has a second portion extending from the first main surface and having a tapered sidewall so as to have a maximum size at the first main surface of the semiconductor substrate, and the second portion of the through hole is filled with a solder so that the protruding electrode of the second semiconductor die is embedded in the solder.

3. A circuit board comprising:

a semiconductor substrate having a through hole penetrating through the semiconductor substrate in a thickness direction thereof;

an active region formed in a first main surface of the semiconductor substrate;

a conductive pattern formed on the first main surface of the semiconductor substrate;

a through-hole electrode formed in the through hole, electrically connected to the conductive pattern, and extending to reach a second main surface of the semiconductor substrate; and a trench formed in the semiconductor substrate, filled with an insulating material and surrounding the active region, the through-hole electrode being formed outside an area of the semiconductor substrate surrounded by the trench, wherein an end of the through-hole electrode projects from the second main surface of the semiconductor substrate, and the through hole has a first portion extending from the second main surface and having a vertical sidewall with respect to the first and second main surfaces and has a second portion extending from the first main surface and having a tapered sidewall so as to have a maximum size at the first main surface of the semiconductor substrate.

4. The semiconductor device of claim 1, further comprising an insulating film formed on the vertical sidewall and the tapered sidewall, wherein the through-hole electrode is formed on the insulating film.

5. The semiconductor device of claim 1, further comprising a dent portion formed in the vertical sidewall of the first portion of the through hole.

6. The semiconductor device of claim 2, wherein a width of the protruding electrode of the second semiconductor die is narrower than the maximum size of the second portion of the through hole, and at least part of the protruding electrode is disposed in the second portion of the through hole.

* * * * *